(12) United States Patent
Nelson et al.

(10) Patent No.: US 7,663,060 B2
(45) Date of Patent: Feb. 16, 2010

(54) SYSTEMS AND METHODS FOR CABLE MANAGEMENT

(75) Inventors: Michael J. Nelson, Prior Lake, MN (US); Michael J. Wayman, Waconia, MN (US); Kevin Thompson, Chaska, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 12/337,352

(22) Filed: Dec. 17, 2008

(65) Prior Publication Data

US 2009/0308631 A1  Dec. 17, 2009

Related U.S. Application Data

(60) Provisional application No. 61/060,584, filed on Jun. 11, 2008.

(51) Int. Cl.
*H02G 3/04* (2006.01)
(52) U.S. Cl. .................. 174/97; 174/72 A; 174/95; 174/101; 174/68.1; 52/220.1; 439/207
(58) Field of Classification Search .......... 174/72 A, 174/72 R, 68.1, 68.3, 101, 95.97; 52/220.1; 419/207; 439/207, 212; 248/68.1, 49
See application file for complete search history.

(56) References Cited

U.S. PATENT DOCUMENTS

| | | | |
|---|---|---|---|
| 3,987,655 A | 10/1976 | Myotte | |
| 4,166,195 A * | 8/1979 | Schwab | 174/95 |
| 4,308,742 A | 1/1982 | Harrison et al. | |
| 4,371,757 A | 2/1983 | Debortoli et al. | |
| 4,549,602 A | 10/1985 | Espinoza | |
| 5,134,250 A * | 7/1992 | Caveney et al. | 174/101 |
| 5,445,787 A | 8/1995 | Friedman et al. | |
| 5,490,408 A | 2/1996 | Ando et al. | |
| 5,710,804 A | 1/1998 | Bhame et al. | |
| 5,806,948 A | 9/1998 | Rowan, Sr. et al. | |
| 5,894,407 A | 4/1999 | Aakula et al. | |
| 6,065,612 A | 5/2000 | Rinderer | |
| 6,082,441 A | 7/2000 | Boehmer et al. | |
| 6,142,595 A | 11/2000 | Dellapi et al. | |
| 6,238,027 B1 | 5/2001 | Kohler et al. | |
| 6,280,232 B1 | 8/2001 | Beecher et al. | |
| 6,340,317 B1 | 1/2002 | Lin | |
| 6,465,561 B1 | 10/2002 | Yarbrough et al. | |
| 6,968,647 B2 | 11/2005 | Levesque et al. | |
| 6,972,367 B2 * | 12/2005 | Federspiel et al. | 174/481 |
| 7,032,277 B2 | 4/2006 | Rolla et al. | |
| 7,225,586 B2 | 6/2007 | Levesque et al. | |
| 2004/0112623 A1 | 6/2004 | L'Henaff et al. | |
| 2004/0121132 A1 | 6/2004 | Slyne | |
| 2007/0247809 A1 | 10/2007 | McClure | |

* cited by examiner

*Primary Examiner*—Dhiru R Patel
(74) *Attorney, Agent, or Firm*—Fogg & Powers LLC

(57) ABSTRACT

A method for cable management in an electronics enclosure is disclosed. The method involves extruding at least one length of material that forms a cable guide having a plurality of partitions defined by one or more cable dividers and two end clip flanges, where the end clip flanges each have at least one snap guide and at least one locking clip channel. The method further involves sizing at least one cable guide assembly from the length of material, based on a predetermined length for the cable guide assembly, and preparing one or more ends of the at least one cable guide assembly.

19 Claims, 8 Drawing Sheets

SYSTEMS AND METHODS FOR CABLE MANAGEMENT

CROSS REFERENCE TO RELATED APPLICATIONS

This application claims the benefit of priority to and incorporates by reference the entirety of U.S. Provisional Patent Application Ser. No. 61/060,584, filed on Jun. 11, 2008 and entitled "SYSTEMS AND METHODS FOR CABLE MANAGEMENT."

This application is also related to the following co-pending and commonly assigned U.S. patent applications, filed on Jun. 11, 2008, each of which is incorporated herein by reference in their entirety:

U.S. patent application Ser. No. 12/137,322, entitled "COMMUNICATION MODULES" and which is referred to here as the '322 Application;

U.S. patent application Ser. No. 12/137,297, entitled "APPARATUS FOR MOUNTING A MODULE AND ENABLING HEAT CONDUCTION FROM THE MODULE TO THE MOUNTING SURFACE" and which is referred to here as the '297 Application;

U.S. Provisional Patent Application Ser. No. 61/060,589, entitled "SUSPENSION METHOD FOR COMPLIANT THERMAL CONTACT OF ELECTRONICS MODULES" and which is referred to here as the '589 Application;

U.S. patent application Ser. No. 12/137,307, entitled "ANGLED DOORS WITH CONTINUOUS SEAL" and which is referred to here as the '307 Application;

U.S. Provisional Patent Application Ser. No. 61/060,523, entitled "L-SHAPED DOOR WITH 3-SURFACE SEAL FOR ENDPLATES" and which is referred to here as the '523 Application;

U.S. Provisional Patent Application Ser. No. 61/060,576, entitled "L-SHAPED DOORS WITH TRAPEZOIDAL SEAL" and which is referred to here as the '576 Application;

U.S. patent application Ser. No. 12/137,309, entitled "SYSTEMS AND METHODS FOR VENTURI FAN-ASSISTED COOLING" and which is referred to here as the '309 Application;

U.S. Provisional Patent Application Ser. No. 61/060,547, entitled "COMBINATION EXTRUDED AND CAST METAL OUTDOOR ELECTRONICS ENCLOSURE") and which is referred to here as the '547 Application;

U.S. Provisional Patent Application Ser. No. 61/060,581, entitled "CAM SHAPED HINGES" and which is referred to here as the '581 Application;

U.S. patent application Ser. No. 12/137,313, entitled "SOLAR SHIELDS" and which is referred to here as the '313 Application;

U.S. Provisional Patent Application Ser. No. 61/060,501, entitled "APPARATUS AND METHOD FOR BLIND SLOTS FOR SELF DRILLING/SELF-TAPPING SCREWS" and which is referred to here as the '501 Application;

U.S. Provisional Patent Application Ser. No. 61/060,593, entitled "SYSTEMS AND METHODS FOR THERMAL MANAGEMENT" and which is referred to here as the '593 Application;

U.S. Provisional Patent Application Ser. No. 61/060,762, entitled "SERF BOARD COMPONENTS" and which is referred to here as the '762 Application; and U.S. Provisional Patent Application Ser. No. 61/060,740, entitled "PULL-OUT SHELF FOR USE IN A CONFINED SPACE FORMED IN A STRUCTURE" and which is referred to here as the '740 Application.

BACKGROUND

In the field of telecommunications, there is a trend to reduce both the size and the expenses associated with infrastructure equipment. The result is a demand on providers of telecommunications infrastructure equipment to provide suitably sized equipment that operates in a more cost effective manner, while retaining all the functionality of legacy equipment.

The modularity of designs proposed for such equipment, along with the sizes desired by system operators, introduces new cable management challenges with respect to ease of installation and ease of maintenance. For example, these proposed designs will need to prevent cables carrying radio frequency (RF) signals, data signals, and power signals from interfering with each other.

For the reasons stated above and for other reasons stated below which will become apparent to those skilled in the art upon reading and understanding the specification, there is a need in the art for improved systems and methods for cable management in electronics enclosures.

SUMMARY

The following specification provides for systems and methods for cable management. This summary is made by way of example and not by way of limitation. It is merely provided to aid the reader in understanding some aspects of at least one embodiment described in the following specification.

Particularly, in one embodiment, a method for cable management in an electronics enclosure is provided. The method involves extruding at least one length of material that forms a cable guide having a plurality of partitions defined by one or more cable dividers and two end clip flanges, where the end clip flanges each have at least one snap guide and at least one locking clip channel. The method further involves sizing at least one cable guide assembly from the length of material, based on a predetermined length for the cable guide assembly, and preparing one or more ends of the at least one cable guide assembly.

BRIEF DESCRIPTION OF THE DRAWINGS

These and other features, aspects, and advantages are better understood with regard to the following description, appended claims, and accompanying drawings where:

The various described features are drawn to emphasize features relevant to the embodiments disclosed. Like reference characters denote like elements throughout the figures and text of the specification.

DETAILED DESCRIPTION

Embodiments disclosed herein relate to systems and methods for cable management in an electronics enclosure. In particular, at least one embodiment includes interlocking, stackable cable guides that provide protection, both physically and electrically, for one or more sets of electrical signal cables installed within an outdoor telecommunications electronics enclosure. In one implementation, for one or more electrical components within the enclosure having separate sets of RF, data, and power cables, the cable guides are extruded to provide separate cable set partitions to reduce any electrical signal interferences and provide electrical isolation between the separate sets of signal cables. In addition, the cable guides further captivate the cable sets within each of the separate cable set partitions to prevent any potential interference with additional physical parts within the enclosure. In one embodiment, rubber end caps prevent any sharp aluminum extrusion edges from wearing on the cables.

Figure 1A:
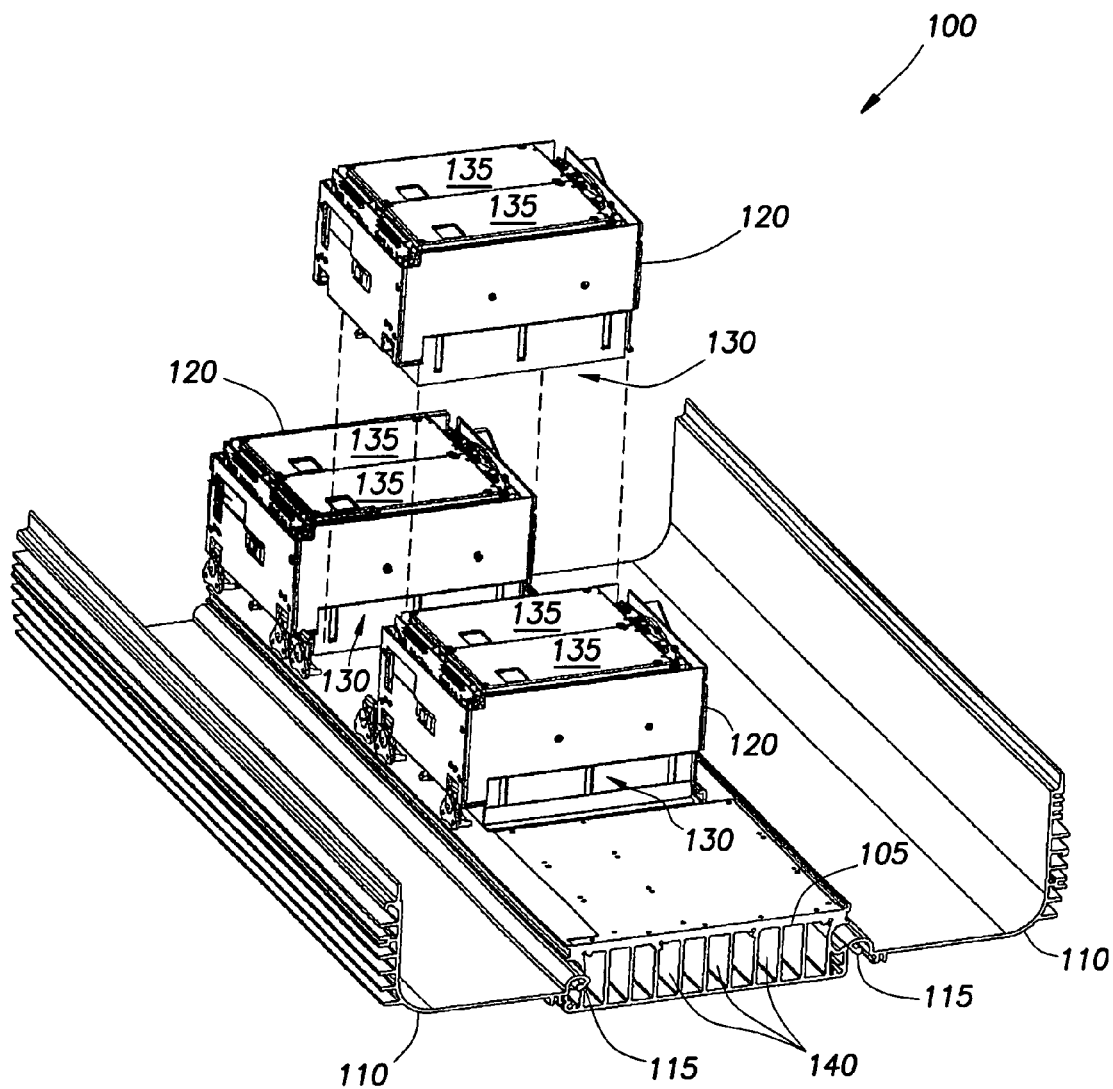
FIGS. 1A and 1B are illustrations of an embodiment of an electronics enclosure.
Figure 1B:
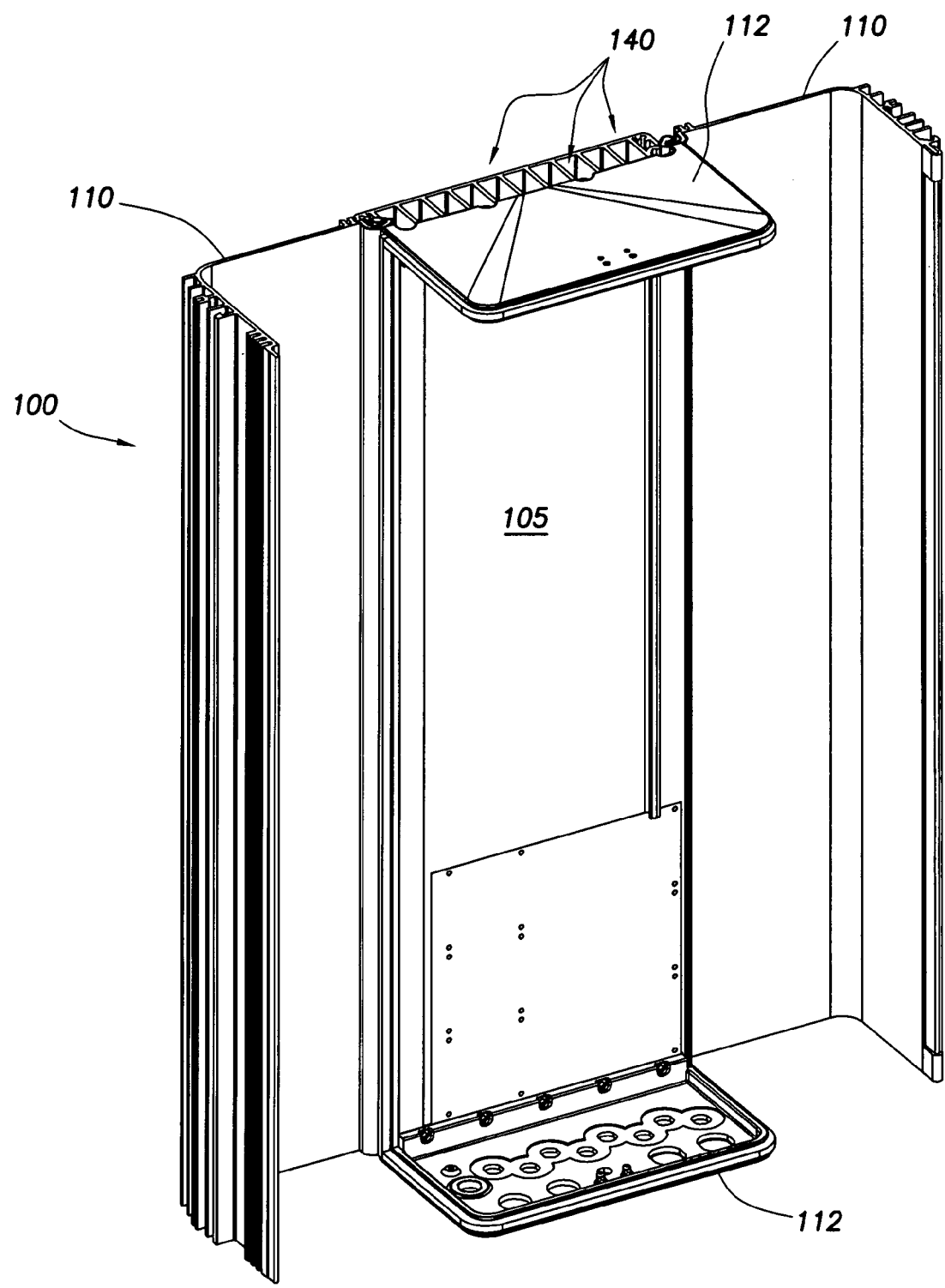

FIGS. 1A and 1B are diagrams illustrating an embodiment of an enclosure 100 having a system and method for cable management. The enclosure 100 comprises a structural backplane 105, two doors 110 that each pivot around respective hinges 115 and two endplates 112 attached (respectively) to the ends of the structural backplane 105. In one embodiment, when the doors 110 are closed, a sealed environment is created within the enclosure 100. In this same embodiment, and at least one alternate embodiment, the enclosure 100 provides a weatherproof sealed environment.

The enclosure 100 is shown in FIG. 1A with the doors 110 in the open position and the endplates 112 removed to reveal one or more electrical components 120 housed within the enclosure 100. In the particular embodiment shown in FIG. 1A, the electrical components 120 include, but are not limited to, the radio frequency (RF) transceiver modules discussed in the '322 Application and the '297 Application. In the particular embodiment shown in FIGS. 1A and 1B, the enclosure 100 is the enclosure described in the '307 Application, wherein the doors 110 are the described "L-shaped" doors that are sealed against the backplane 105 by a continuous perimeter seal. In addition, in the particular embodiment shown in FIGS. 1A and 1B, the hinges 115 are the cam-shaped hinges as described in the '581 Application.

The electrical components 120 include high powered internal electronics (shown generally at 130) which provide for functions such as, but not limited to, power supplies and amplifiers, and low power internal electronics (shown generally at 135) which provide for functions such as, but not limited to, digital signal processing, signal modulation and demodulation and various other functions. As described in further detail in the '322 Application, each of the electrical components 120 provides for a complete radio transceiver unit of a particular communications band. As such, each of the electrical components 120 have access to power, data and RF signal cables which are shielded from each other to prevent any form of induced inter-cable interference. In addition, the power, data, and RF signal cables from each of the electrical components 120 are shielded from power, data, and RF signal cables of the other electrical components 120 within the enclosure 100 to prevent any form of induced inter-component interference between electronics of one communications band and electronics of another communications band.

Figure 2A:
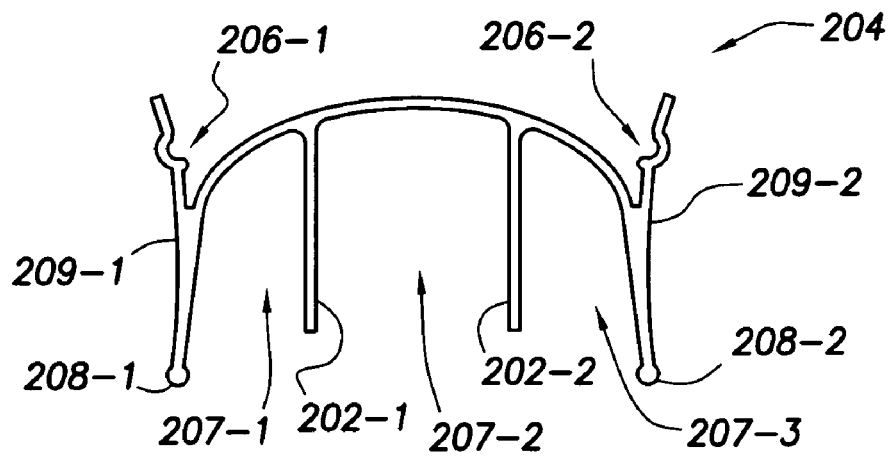
FIGS. 2A and 2B are illustrations of an embodiment of a cable guide for cable management.
Figure 2B:
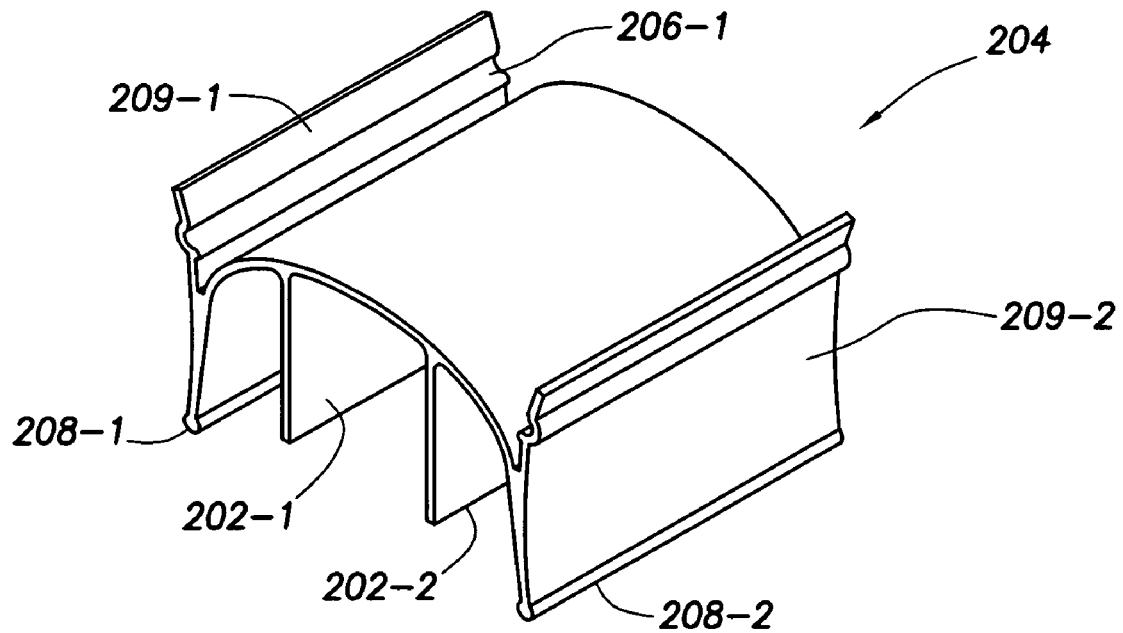

Embodiments discussed herein provide for cable management in the enclosure 100 through a system of cable guides as illustrated in FIGS. 2A-2D and FIGS. 3A and 3B. FIG. 2A is a side view, and FIG. 2B is a perspective view, of an embodiment of a cable guide 204 for cable management. Referring first to FIG. 2B, the cable guide 204 comprises cable dividers 202-1 and 202-2, end clip flanges 209-1 and 209-2, locking clip channels 206-1 and 206-2, and snap guide ends 208-1 and 208-2. In one embodiment, the cable guide 204 is comprised of a material extruded in an extrusion process similar to the extrusion process disclosed in the '547 Application. With respect to FIG. 2A, the three spaces created between the flange 209-1 and the cable divider 202-1, the cable divider 202-1 and the cable divider 202-2, and the cable divider 202-2 and the flange 209-2, respectively, define partitions 207-1, 207-2, and 207-3 within the cable guide 204. As discussed in further detail below, the partitions 207 provide electrical shielding, as well as physical separation, between cable types for the electrical components installed in the enclosure.

Figure 2C:
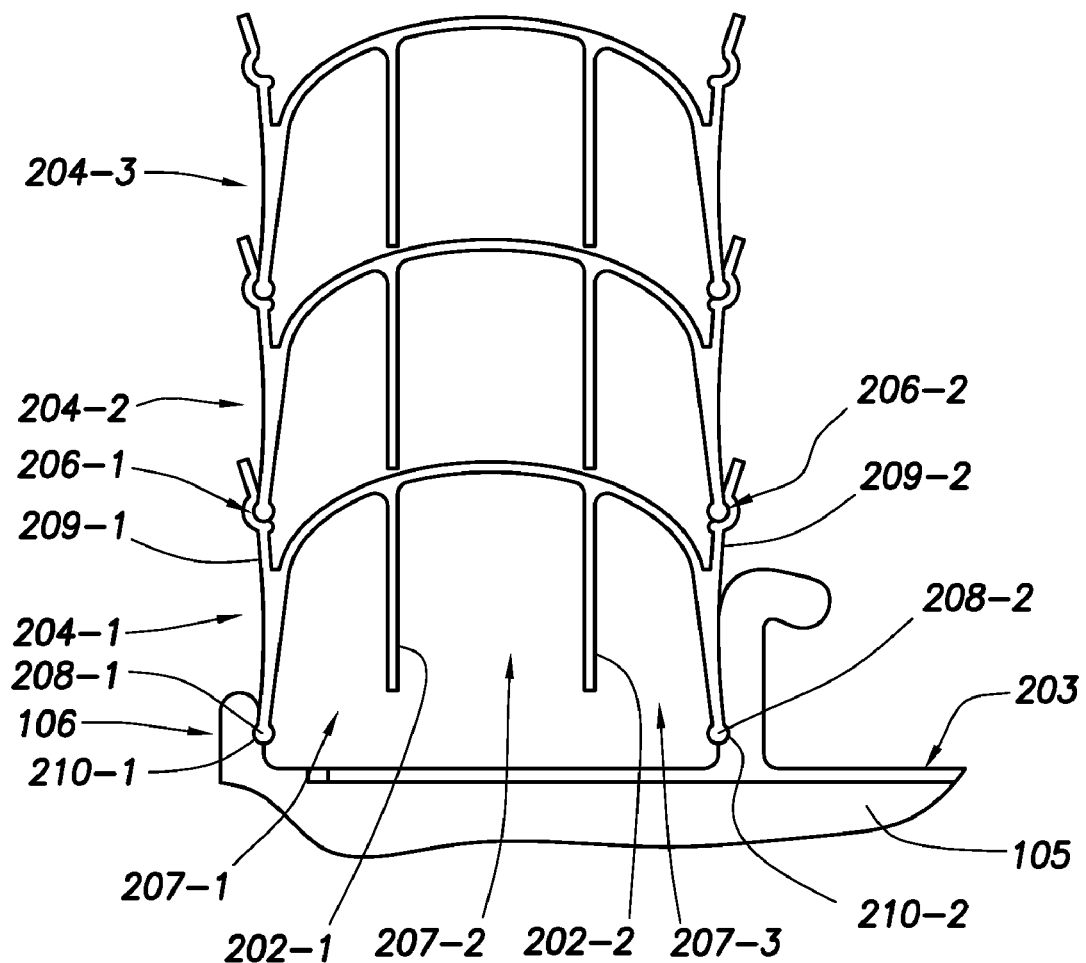
FIG. 2C is an illustration of an embodiment of stacked cable guides for cable management.

FIG. 2C illustrates a set of three cable guides 204-1 to 204-3 stackably mounted onto a base 203 provided by the backplane 105 of the enclosure 100. In the example embodiment of FIG. 2C, the track 106 is extruded with locking clip channels 210-1 and 210-2. For ease of description, it is understood that each of the cable guides 204-1 to 204-3 comprise each of the above-mentioned features with respect to the cable guide 204.

The material used to manufacture the cable guides 204-1 to 204-3 provides a spring-like tension when one of the cable guides 204 securely fastens on top of another cable guide 204 in an interlocking, stacking fashion. For example, when the cable guide 204-1 is secured within a track 106, the snap guide ends 208-1 and 208-2 (of the cable guide 204-1) are compressed together, creating a spring-like force into the locking clip channels 210-1 and 210-2 to lock the cable guide 204-1 in place on the backplane 105.

The cable guides 204-2 and 204-3 similarly stack on top of the cable guide 204-1 and 204-2, respectively. For example, the snap guide ends 208-1 and 208-2 of the cable guide 204-2 compress together, creating a spring-like force into the locking clip channels 210-1 and 210-2 of the cable guide 204-1 to lock the cable guide 204-2 into the cable guide 204-1. It is understood that in alternate embodiments, any appropriate number of the cable guides 204 are suitable for interlocking and stacking as depicted in FIG. 2C depending on cabling requirements and physical layout of a particular electronics enclosure.

Figure 2D:
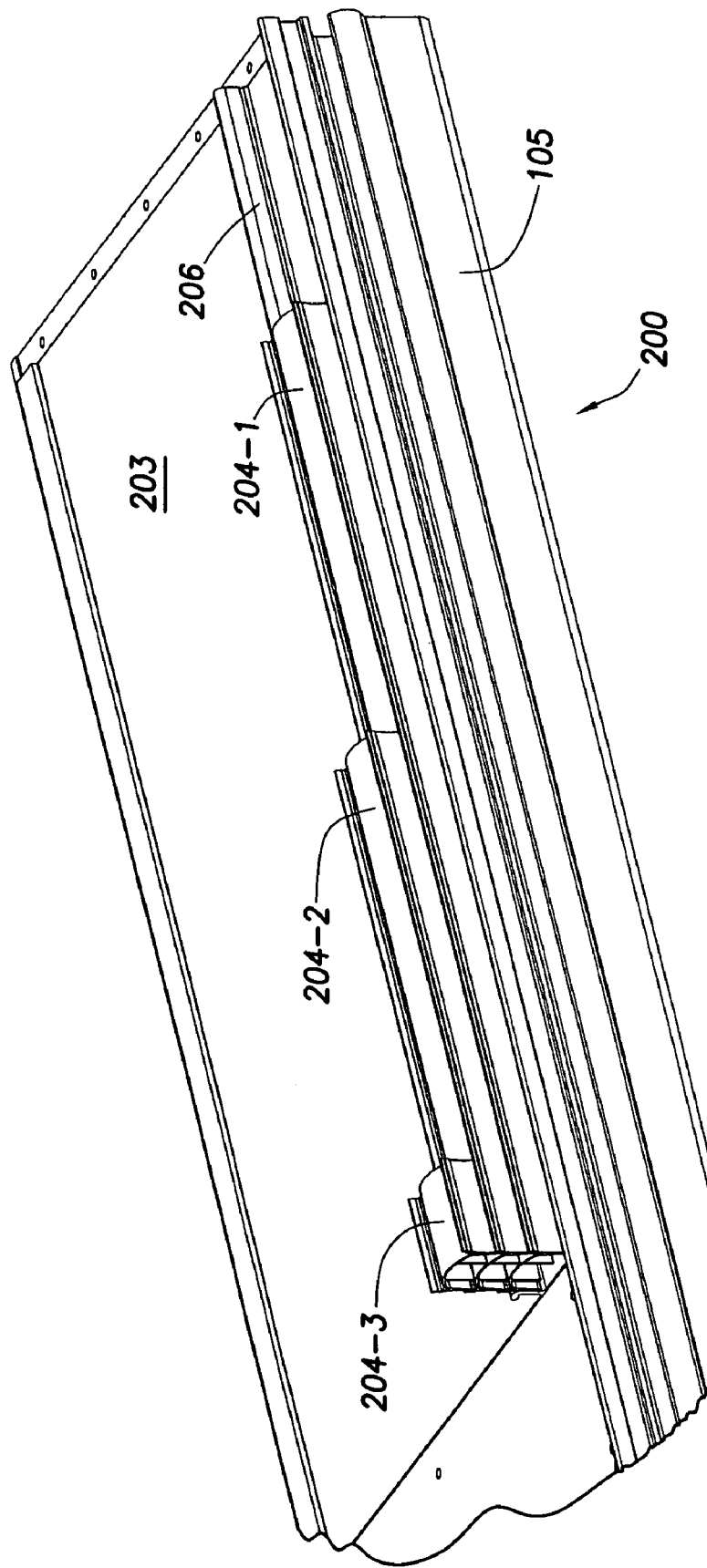
FIG. 2D is an illustration of an embodiment of stacked cable guides for cable management in an electronics enclosure.

FIG. 2D is a perspective view of an embodiment of a backplane 105 from the enclosure 100 of FIGS. 1A and 1B (the doors 110, endplates 112 and the electrical components 120 are not shown for clarity) showing stacked cable guides 204-1 to 204-3 installed on a base 203. The backplane 105 comprises the base 203 and the track 106 for receiving cable guides 204-1 to 204-3 as further discussed above with respect to FIG. 2C. In at least one implementation, the track 106 is placed along a path of at least one cable route for the enclosure 100. In one embodiment, the track 106 is extruded along with the backplane 105 similar to the extrusion process disclosed in the '547 Application. Each of the cable guides 204-1 to 204-3 is stacked for a cable set of a particular electrical component 120 based on the installation location of this particular electrical component 120 within the enclosure 100. Thus, the cable guides 204-1, 204-2, and 204-3 are appropriately sized to meet the various length requirements to guide the signal cables to their respective electrical component 120.

In one embodiment, each of the cable guides 204-1, 204-2, and 204-3 are cut from a single length of extruded cable guide material. In alternate embodiments, a greater or fewer number of cable guides 204 are used depending on the number of electrical components 120 installed within the enclosure 100.

The above-discussed interlocking stacking features of the cable guides 204 compartmentalize power cables and data and RF signal cables between individual electrical components 120 and along the cable route within the enclosure 100. In one embodiment, the base 103 and the backplane 105 are grounded components (that is, they are either directly or indirectly coupled to an Earth ground), and the cable guides 204 further function to provide a cabling shield and grounding path within the electronics enclosure 100 to prevent any interference between cable sets for different electrical components 120. As such, the conductive nature of the cable guides 204-1 to 204-3 ensures that each cable guide 204 is grounded for a set of stacked cable guides 204.

In one embodiment, a finishing process for the cable guides 204 involves applying a relatively thin chromate layer on to enhance the grounding properties of the cable guides 204 when installed in the enclosure 100. Through the partitions 207-1, 207-2 and 207-3, the cable dividers 202-1 and 202-2 within the cable guides 204 also provide for the further physical separation and electrical shielding of the signal cables for each of the components 120. In addition, protective end caps, as discussed below with respect to FIG. 3A, prevent any sharp extruded edges of the cable guides 204 from slicing or otherwise damaging the cables. These end caps further assist to retain the cables within each of the cable guides 204 as cable connections are finalized within the enclosure 100.

Figure 3A:
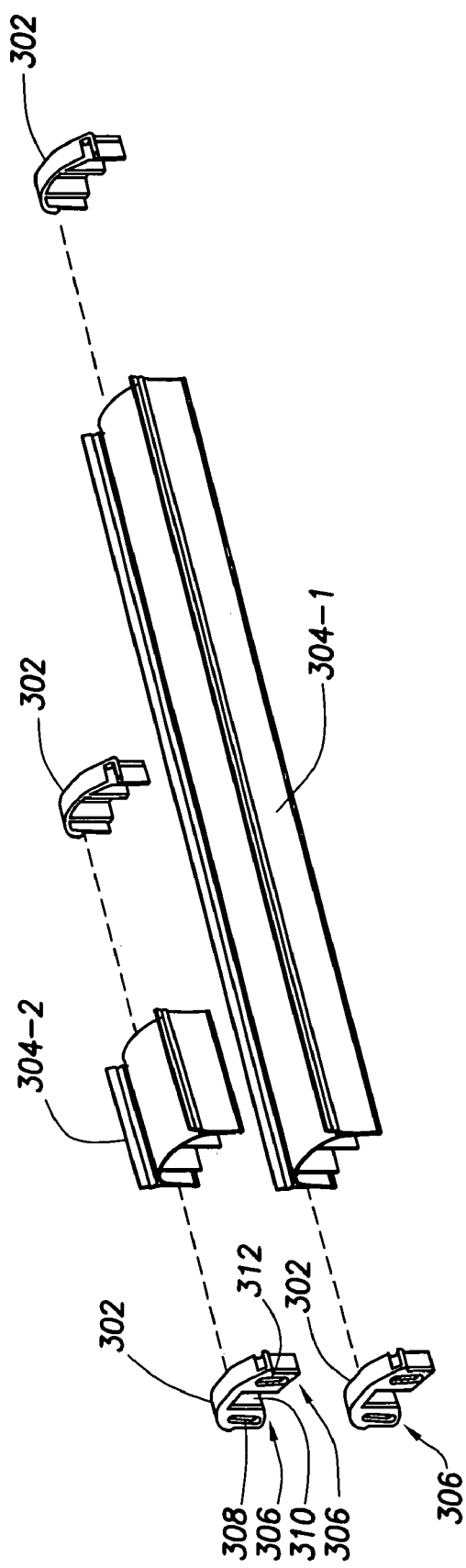
FIG. 3A is an illustration of an embodiment of cable guides for cable management.

FIG. 3A is an exploded perspective view of an embodiment of cable guides 304-1 and 304-2 that have the properties described with respect to the cable guides 204 of FIGS. 2A to 2C. In particular, FIG. 3A illustrates the placement of end caps 302 on opposing ends of each of the cable guides 304-1 and 304-2. The end caps 302 are molded members having a profile for insertion into, and over, the cable guides 304-1 and 304-2.

Figure 3B:
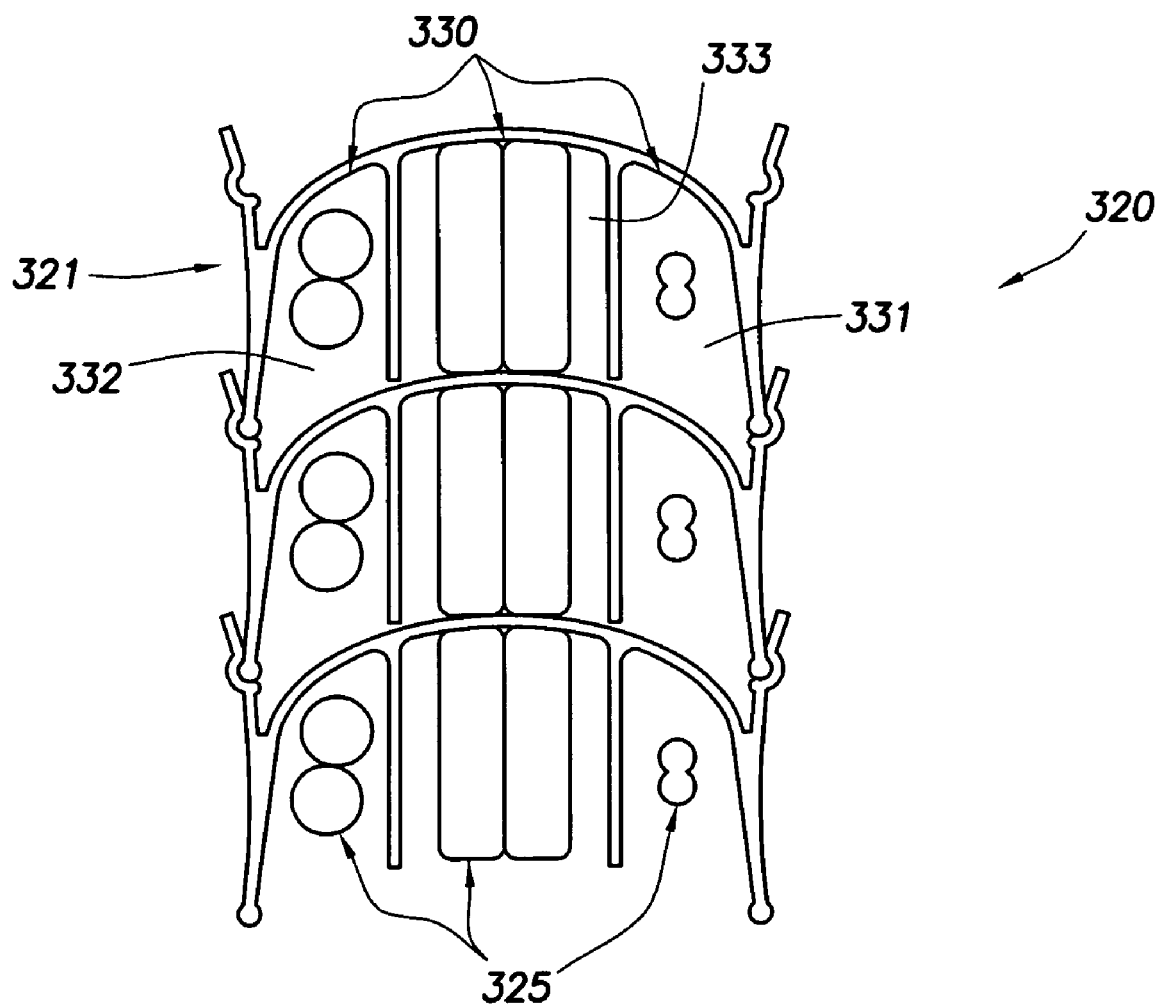
FIG. 3B is an illustration of an embodiment of stacked cable guides for cable management.

In one embodiment, the end caps 302 are fabricated using a soft, pliable material (such as rubber, or the like) that further retain cables within each partition of the cable guides 304 as shown in FIG. 3B. In this same (and at least one alternate) embodiment, the end caps 302 are grommet end caps that provide mechanical protection for cable sets within the cable guides 304-1 and 304-2. Each of the end caps 302-1 to 302-3 comprises a first aperture 308, a second aperture 310, and a third aperture 312. In one embodiment, the end caps 302 further include one or more press-fit slits 306 for inserting cables into place into the first aperture 308, the second aperture 310, and the third aperture 312.

FIG. 3B is a side view of an embodiment of three stacked cable guides, shown generally at 320, with cables (shown generally at 325) installed into respective power, data, and RF signal cable partitions as shown generally at 330. For example, in one implementation, a first cable guide (shown generally at 321) includes a first partition 331 for RF signal cables, a second partition 332 for data signal cables, and a third partition 333 for power cables.

In addition to the features discussed above, the cable guides of FIG. 3B also assist in the installation and maintenance of cabling for electronic enclosures similar to the enclosure 100 of FIG. 1A. For example, during installation of the component 120 into the enclosure 100, a pre-measured length of the cable guide 304 is fitted with the end caps 302 and pre-measured lengths of each cable type (power, data, and RF signal) installed into a designated partition in the cable guide 304. The pre-assembled cable guide 304 is then installed into the enclosure. Subsequent pre-assembled cable guides 304 would snap in to already-assembled cable guides 304 (as discussed above with respect to the cable guides 204 of FIG. 2C). In one embodiment, the cable guide assembly 304 having the longest length is installed first, with each subsequently installed cable guide 304 shorter in length than the previously installed cable guide 304. As discussed above, designated cables inserted into each of the cable guides 304 are organized and installed according to a location of the designated electrical component 120 within the enclosure 100.

In addition to the benefits discussed above, the cable guides also ease the installation and maintenance requirements for electronic enclosures. For example, during installation of an electronics component module into an enclosure, a pre-measured length of cable guide can be fitted with end caps and pre-measured lengths of the power, data and RF signal cables are installed into the cable guide with each cable type (power, data and RF signal) installed into a designated partition in the cable guide. The pre-assembled cable guide is then installed into the enclosure. Subsequent pre-assembled cable guides would snap in to already-assembled cable guides as discussed above. In one embodiment, the longest length cable guide assembly is installed first, with each subsequently installed cable guide shorter in length than the previously installed cable guide. As discussed above, designated cables inserted into each of the cable guides 304 are organized and partitioned according to a location of the designated electronics module within the electronics enclosure.

Although embodiments described herein discuss partitioning a cable guide based on separate partitions for power, data and RF signal cables, one of ordinary skill in the art upon reading this specification would appreciate that other criteria is suitable as the basis for separating other cable types. For example, in one alternate embodiment, cables designated for a primary system are placed into a separate partition (either in the same cable guide or in a different cable guide) than cables for a secondary system that provides backup to the primary system.

Figure 4:
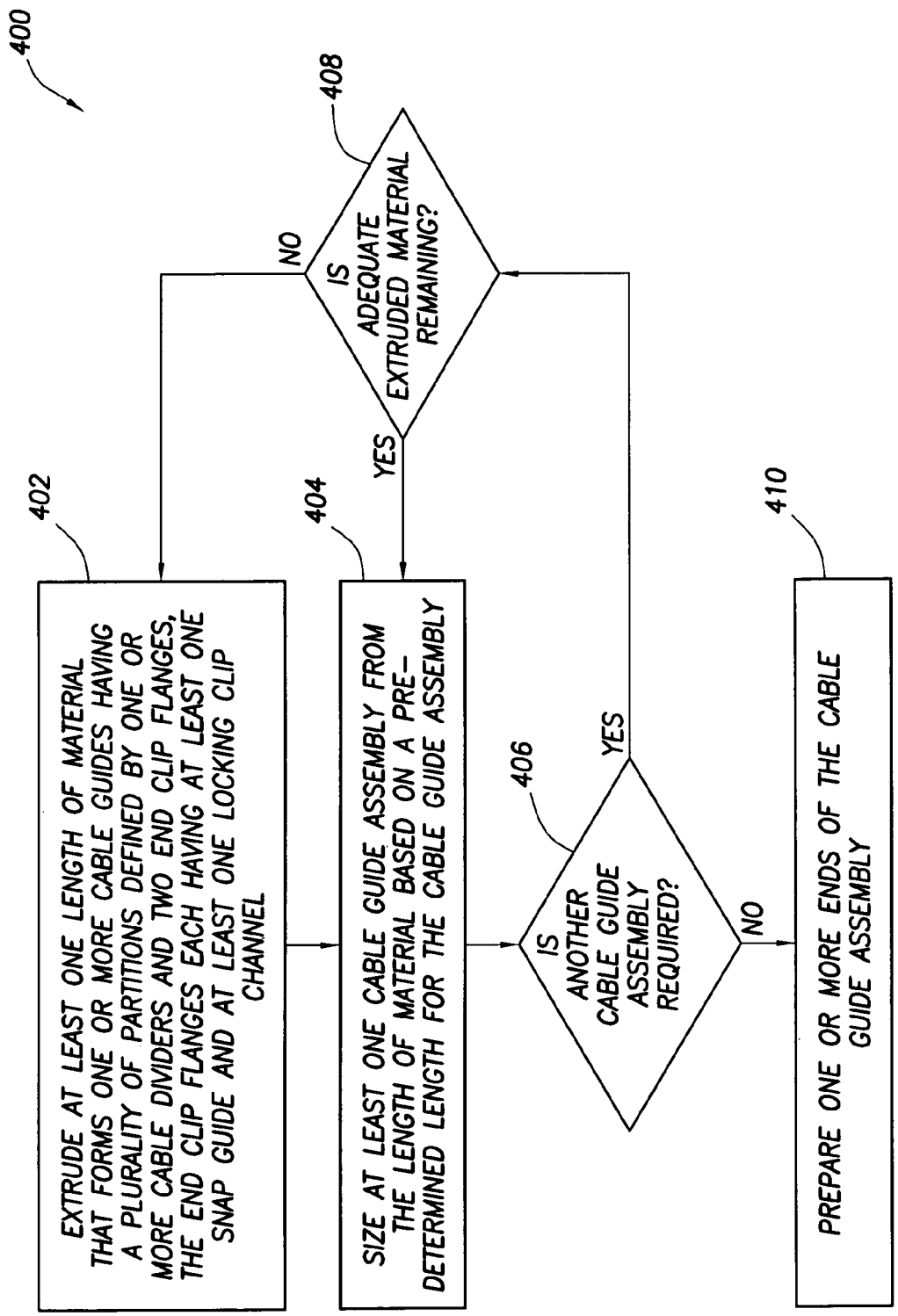
FIG. 4 is a flow diagram of an embodiment of a method for cable management in an electronics enclosure.

FIG. 4 is a flow diagram of an embodiment of a method 400 for cable management in an electronics enclosure. The method shown in FIG. 4 addresses providing a plurality of interlocking, extruded cable guides at one or more lengths for a predetermined configuration of electrical components within the electronics enclosure.

The method begins at block 402 with extruding at least one length of material that forms a cable guide having a plurality of partitions defined by one or more cable dividers and two end clip flanges, the end clip flanges each having at least one snap guide and at least one locking clip channel. In one embodiment, the length of material is extruded to have a profile such as that shown for cable guide 204 in FIGS. 2A and 2B. The end clip flanges and locking clip channels are extruded to allow cable guide assemblies formed from the at least one length of material to snap into each other, and into the electronics enclosure as shown in FIG. 2C. However, one of ordinary skill in the art upon reading this specification would appreciate that other profiles may be extruded based on the particular cabling configuration of a particular application. For example, embodiments having only one partition, two partitions, or having more than three partitions are contemplated as within the scope of embodiments of the present invention. Such partitions captivate the cables within their assigned partitions such that they do not interfere with other cables, interfere with any physically moving parts within the enclosure, or contact heated surfaces that may cause damage to the cables.

As discussed above, the plurality of partitions provide for the physical separation between cable types, as well as electrical shielding between cable types. In one embodiment, the length of material comprises a metal or other electrically conductive material such as, but not limited to, aluminum and conductive coated plastic. For applications where physical separation is desired, but the need for electrical shielding is not a concern, the length of material may be comprised of a plastic or other composite material. The method continues to block 404 with sizing a cable guide assembly from the length of material based on a predetermined length for the cable guide assembly. In one embodiment, the extruded length of material is cut to form the cable guide assembly. In one embodiment, only a length of material equal to the predetermined length for the cable guide assembly is extruded from the extruding machine. If after block 404 another cable guide assembly is required (block 406) and there is adequate extruded material remaining (block 408), the method returns to block 404 to size another cable guide assembly from the length of material. If there is not adequate extruded material remaining, the method returns to block 402 to extrude another length of material that forms a cable guide.

In one embodiment, the method (at block 410) further comprises preparing the ends of the one or more cable guide assemblies produced in blocks 402 to 408. In one embodiment, preparing the ends comprises machining the ends to eliminate burs and sharp edges. In one embodiment, preparing the ends comprises fitting the ends with end caps such as, but not limited to end caps 302.

Although specific embodiments have been illustrated and described herein, it will be appreciated by those of ordinary skill in the art that any arrangement, which is calculated to achieve the same purpose, may be substituted for the specific embodiments shown.

As one example, electrical enclosures having only a single door, or multiple doors having shapes different from those described above are contemplated as within the scope of the specific embodiments described herein. These embodiments are intended to cover any modifications, adaptations, and variations, which fall within the scope of the following claims.

What is claimed is:

1. A method for cable management in an electronics enclosure, the method comprising:
   extruding at least one length of material that forms a cable guide having a plurality of partitions defined by one or more cable dividers and two end clip flanges, the end clip flanges each having at least one snap guide and at least one locking clip channel;
   sizing at least one cable guide assembly from the length of material based on a predetermined length for the cable guide assembly, the cable guide assembly having one or more ends; and
   preparing the one or more ends of the at least one cable guide assembly.

2. The method of claim 1, wherein extruding the at least one length of material that forms the cable guides comprises extruding the end clip flanges and locking clip channels with the cable guides to form the at least one length of material.

3. The method of claim 1, wherein the at least one length of material comprises electrical shielding material inserted between each of the defined cable dividers.

4. The method of claim 1, wherein sizing the at least one cable guide assembly comprises cutting the extruded length of material to form one or more lengths of the cable guide assembly.

5. The method of claim 1, wherein preparing the one or more ends of the cable guide assembly comprises:
   machining the ends to substantially eliminate burs and sharp edges; and
   fitting the ends with end caps.

6. A system for cable management in an electronics enclosure, comprising:
   a backplane for an electronics enclosure, the backplane having a track extruded along with the backplane and within the enclosure, the track placed along a path of a cable route within the enclosure, the track having a plurality of track locking clip channels; and
   a first cable guide having a first one or more cable dividers and a first two end clip flanges, each of the first two end clip flanges of the first cable guide having at least a first snap guide and a first locking clip channel, wherein the first cable guide snaps into the track of the backplane of the electronics enclosure at the plurality of track locking clip channels.

7. The system of claim 6, further comprising:
   a first end cap coupled to a first end of the first cable guide and a second end cap coupled to a second end of the first cable guide.

8. The system of claim 6, further comprising:
   a second cable guide having partitions defined by one or more second cable dividers and a second two end clip flanges, each of the second two end clip flanges of the second cable guide having at least a second snap guide and a second locking clip channel.

9. The system of claim 8, wherein the second cable guide stacks on top of the first cable guide.

10. The system of claim 9, wherein the second cable guide snaps into the first cable guide at the first locking clip channels of the first cable guide.

11. The system of claim 8, wherein the first cable guide and the second cable guide are electrically coupled to ground via the track.

12. The system of claim 6, wherein the track and the backplane are grounded components.

13. The system of claim 6, wherein the first cable guide comprises an electrically conductive shielding material.

14. A cable guide, comprising:
   one or more cable dividers formed from an extruded material;
   at least two end clip flanges coupled to the one or more cable dividers and formed from the extruded material, each of the at least two end clip flanges having:
      a snap guide end shaped to engage a corresponding locking clip channel of a base; and
      a locking clip channel for the end clip flange, the locking clip channel shaped to receive a second snap guide end of another cable guide; and
   the at least two end clip flanges and the one or more cable dividers arranged to define a plurality of partitions within the cable guide.

15. The cable guide of claim 14, further comprising:
   end caps coupled to at least one end of the extruded material, the end caps having apertures between each of the plurality of partitions, wherein the end caps prevent any extruded edges of the extruded material from damaging the cables.

16. The cable guide of claim 15, wherein the end caps further comprise press-fit slits.

17. The cable guide of claim 14, wherein the base is one of a track or another cable guide.

18. The cable guide of claim 14, wherein the plurality of partitions are defined between the at least two end clip flanges.

19. The cable guide of claim 14, wherein the extruded material comprises an electrically conductive material.

* * * * *